United States Patent [19]
Wu

[11] Patent Number: 6,117,712
[45] Date of Patent: *Sep. 12, 2000

[54] METHOD OF FORMING ULTRA-SHORT CHANNEL AND ELEVATED S/D MOSFETS WITH A METAL GATE ON SOI SUBSTRATE

[75] Inventor: Shye-Lin Wu, Hsinchu, Taiwan

[73] Assignee: Texas Instruments - Acer Incorporated, Hsinchu, Taiwan

[*] Notice: This patent is subject to a terminal disclaimer.

[21] Appl. No.: 09/248,955

[22] Filed: Feb. 12, 1999

Related U.S. Application Data

[63] Continuation-in-part of application No. 09/042,348, Mar. 13, 1998, Pat. No. 5,956,580.
[51] Int. Cl.[7] .................................................. H01L 21/00
[52] U.S. Cl. ........................ 438/163; 438/307; 438/589; 438/622
[58] Field of Search .................................... 438/163, 589, 438/142, 197, 151, 270, 282, 149, 622, 631

[56] References Cited

U.S. PATENT DOCUMENTS

| 5,434,093 | 7/1995 | Chau et al. | 437/41 |
|---|---|---|---|
| 5,583,064 | 12/1996 | Lee et al. | 437/41 |
| 5,705,405 | 1/1998 | Cunningham | 437/21 |
| 5,773,348 | 6/1998 | Wu | 438/305 |
| 5,877,056 | 3/1999 | Wu | 438/291 |
| 5,956,580 | 9/1999 | Wu | 438/163 |
| 6,008,079 | 12/1999 | Wu | 438/175 |

Primary Examiner—Matthew Smith
Assistant Examiner—Lex H. Malsawma
Attorney, Agent, or Firm—Harness, Dickey & Pierce, P.L.C.

[57] ABSTRACT

The method includes forming a buried oxide layer in a substrate. A pad oxide layer is then formed on the substrate. A silicon nitride layer is pattered on the surface of the pad oxide. Then, a thick field oxide (FOX) is formed on the pad oxide layer. Sidewall spacers are formed on the side walls of the opening of the silicon nitride layer. Next, the FOX is etched. An ion implantation is performed for adjusting the threshold voltage and anti-punch-through implantation. Subsequently, a dielectric with high permittivity is deposited along the surface of the substrate. The dielectric layer may be formed by a nitride technique. A conductive layer composed of metal or alloy is then formed on the dielectric layer and refilled into the opening. A chemical mechanical polishing is used to remove the dielectric layer, silicon nitride and the spacers such that the conductive layer remains only in the opening. The residual nitride and spacers are removed by hot phosphor acid solution. Source and drain are next created. The pad oxide layer and the FOX are then removed. Then, the lightly doped drain (LDD) are formed. A self-aligned silicide (SALICIDE) layer is formed on the substrate exposed by the gate.

18 Claims, 5 Drawing Sheets

METHOD OF FORMING ULTRA-SHORT CHANNEL AND ELEVATED S/D MOSFETS WITH A METAL GATE ON SOI SUBSTRATE

This is a continuation-in-part of U.S. patent application Ser. No. 09/042,348, filed Mar. 13, 1998, Now U.S. Pat. No, 5,956,580.

FIELD OF INVENTION

The present invention relates to a semiconductor device, and more specifically, to a method of fabricating a metal oxide semiconductor field effect transistor (MOSFET) having ultra-short channel and elevated source and drain on an ultra-thin SOI substrate.

BACKGROUND OF THE INVENTION

The semiconductor industry has recently advanced at an ever-increasingly brisk pace. In order to achieve high performance integrated circuits or high package density of a wafer, the sizes of semiconductor devices have become smaller and smaller compared with devices known before in the field of Ultra Large Scale Integrated (ULSI) technologies. Integrated circuits include more than a million devices in a specific area of a wafer and electrically connecting structure for connecting these devices to perform desired function. One of the typical devices is the metal oxide semiconductor field effect transistor (MOSFET). The MOSFET has been widely, traditionally applied in the semiconductor technologies. In accordance with the trend of integrated circuits, the fabrication of the MOSFET also confronts various issues in its fabrication The typical issue that relates to hot carriers injection is overcome by the development of the lightly doped drain (LDD) structure.

The thin film silicon on insulator (SOI) structure is interesting due to potentially alleviated short channel effects. Further the requirement of the devices towards high driving capability. For deep sub-micron meter MOS devices, the SOI (silicon on insulator) is an ideal structure for forming the MOS devices. At present the thin film on the SOI structure plays an important role in the evolution in the semiconductor technologies due to the requirement of the low operation power and power consumption. Further, the fully-depleted (FD) SOI MOS offers a higher driving capability, reduced parasitic capacitance and reduced short channel effects as compared to the bulk or partially (PD) SOI MOS. One device that has been proposed for ultra-low voltage operation is a configuration of a PD SOI structure. An article relating to the SOI is "Thin Film Silicon on Insulator: An Enabling Technology", Michael Alles, et al., Semiconductor International, p. 67 (1997). One of the methods to form the SOI structure is called SIMOX (separation by implantation of oxygen). The method involves the implantation of oxygen ions into a substrate, then the following step is performed by a high temperature anneal. Wafer bonding is another primary means of low cost for forming the SOI structure. Two wafers respectively have oxide on the surfaces. The two wafers are bounded together by joining at room temperature, followed by an anneal to strengthen the bond.

However, the high series source and drain (S/D) resistance of the thin FD SOI transistors will limit the device performance. Su has proposed a method to reduce the series resistance in "Optimization of Series Resistance in Sub-0.2 $\mu$m SOI MOSFET'S", L. K. Su et al., IEEE, Electron Device Lett., vol. EDL-15, P. 145 (1994). One of the solutions is the use of silicide to reduce the S/D sheet resistance. Su used the titanium/cobalt silicidation to overcome this issue. Also, it is difficult to define the gate length to below 0.1 $\mu$m due to the limit of current optical lithography. Please refer to "Short-Channel-Effect-Suppressed Sub-0.1-$\mu$m Grooved-Gate MOSFET'S with W Gate", S. Kimura et al., IEEE Trans. Electron Device Lett., vol. ED-42, P. 94 (1995). In the paper, Kimura disclosed a grooved-gate Si MOS with tungsten gates to suppress the short channel effect.

SUMMARY OF THE INVENTION

A buried oxide layer is formed in a substrate. A pad oxide layer is then form on the surface of the substrate. Thus, a silicon layer is created between the buried oxide and the pad oxide. A silicon nitride layer having an opening is patterned on the surface of the pad oxide to expose a portion of the pad oxide. Then, a thick field oxide (FOX) is formed on the exposed pad oxide layer by thermal oxidation. Sidewall spacers are formed on the side walls of the opening. Next, the exposed portion of the FOX is etched using the spacers as a mask. An ion implantation is performed through the opening into the substrate for adjusting the threshold voltage and anti-punch-through implantation. A high temperature anneal is optionally performed in ambient containing $O_2$ or $N_2O$ to recover the etching damage. Simultaneously, a silicon oxynitride layer is formed at the bottom of the opening.

The thermal oxynitride layer is removed. Subsequently, a dielectric with high permittivity (or high dielectric constant) is deposited along the surface of the substrate. The dielectric layer is formed of titanium oxide ($Ta_2O_5$), barium strontium titanium (BST) or PZT. Preferably, the dielectric layer is formed of nitride formed by JVD (jet vapor deposition). The dielectric layer may be formed by nitride technique.

A conductive layer composed of metal or alloy is then formed on the dielectric layer and is refilled into the opening. A chemical mechanical polishing is used to remove the dielectric layer, silicon nitride and the spacers such that the conductive layer remains only in the opening. The residual nitride and spacers are removed by a hot phosphor acid solution. Source and drain are next created by an implantation. The dopants are subsequently activated by means of high temperature anneal. The pad oxide layer and the FOX are then removed. Then, a blanket ion implantation with low energy and low dose is carried out to implant dopant to form the lightly doped drain (LDD). The thick oxide layer is formed on the substrate by CVD, followed by etching the oxide layer to form spacers on the side walls of the gate. A self-aligned silicide (SALICIDE) layer is formed on the substrate exposed by the gate.

BRIEF DESCRIPTION OF THE DRAWING

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
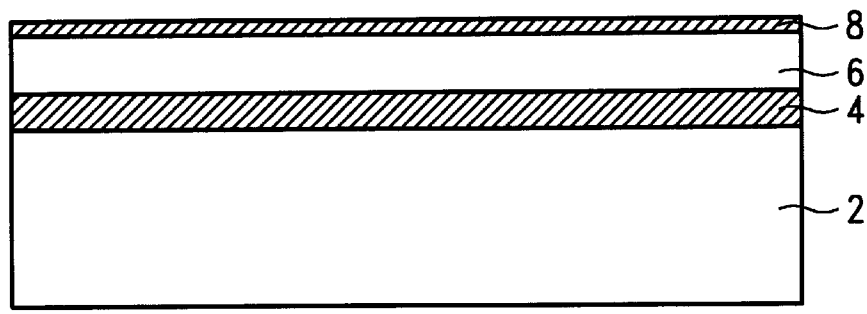
FIG. 1 is a cross-sectional view of a semiconductor wafer illustrating the steps of forming a buried oxide layer in a semiconductor substrate according to the present invention.

The present invention proposes a novel method of fabricating an ultra-short channel elevated S/D MOSFET on an ultra-thin SOI (silicon on insulator) substrate. The MOS with ultra-short channel can be obtained by using spacers as an etching mask. The elevated silicide S/D contacts are used to reduce the parasitic resistance for achieving the high performance SOI devices. Further, the ultra-thin silicon layer for high SOI MOS can be obtained by means of the local oxidation. An article relating to the matter is proposed by O. Faynot, "High Performance Ultra thin SOI MOSFET'S Obtained by Localized Oxidation", IEEE, Electron Device Lett., vol. EDL-15, P. 175 (1994). In the present invention, the short channel effect can be suppressed by using the elevated source and drain junction and ultra-short channel. The gate according to the present invention is formed of metal or alloy. Further, JVD (jet vapor deposition) is also introduced in the embodiment as the gate dielectric for reduction of gate leakage current. The embodiment of the present invention will be seen as follows.

In a preferred embodiment, a single crystal silicon substrate 2 with a <100> crystallographic orientation is provided. The substrate 2 has a SOI structure 4 formed therein. There are various methods to form the SOI structure 4 in the substrate 2 are well known in the art. For example, the SIMOX (separation by implantation of oxygen) can be employed to achieve the buried insulator, i.e. the SOI structure 4. First, an ion implantation containing oxygen ions is performed to dope oxygen into the substrate 2. Then, a high temperature anneal is used to form the SOI structure 4 at a temperature about 1100 to 1350 degrees centigrade. A pad oxide layer 8 is then form on the surface of the substrate 2. Thus, a silicon layer 6 is created between the SOI structure 4 and the pad oxide 8. Typically, the pad oxide layer 8 is formed in oxygen ambient at a temperature of about 800 to 1100 centigrade degrees. In the embodiment, the thickness of the pad oxide layer 8 is approximately 15–250 angstroms. Alternatively, the pad oxide layer 8 may be formed using any suitable oxide chemical compositions and procedures, such as chemical vapor deposition.

Figure 2:
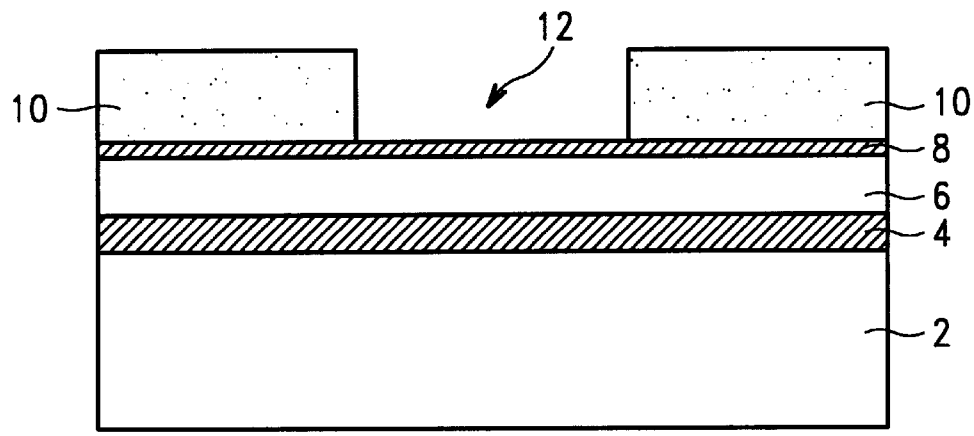
FIG. 2 is a cross-sectional view of a semiconductor wafer illustrating the step of patterning a silicon nitride layer according to the present invention.
Figure 3:
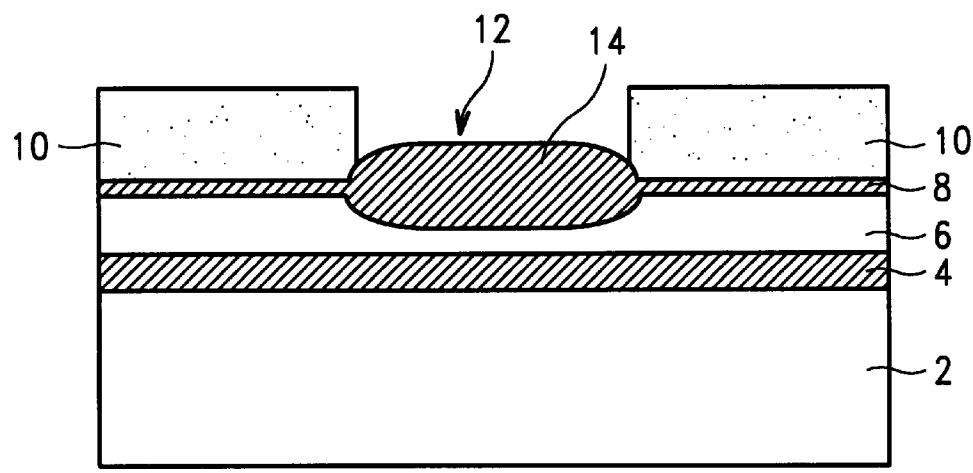
FIG. 3 is a cross-sectional view of a semiconductor wafer illustrating the step of forming a thermal oxide on the substrate according to the present invention.

Turning to FIG. 2, a silicon nitride layer 10 having an opening 12 is patterned on the surface of the pad oxide 8 to expose a portion of the pad oxide 8 and define the active area. Then, a thick field oxide (FOX) 14 is formed on the exposed pad oxide layer 8 by thermal oxidation. In this case, a thermal oxidation in steam environment is used to grow the FOX 14 to a thickness of about 1000–8000 angstroms, as shown in FIG. 3. The thickness of the silicon layer 6 under the FOX 14 is shrunk due to the local steam oxidation.

Figure 4:
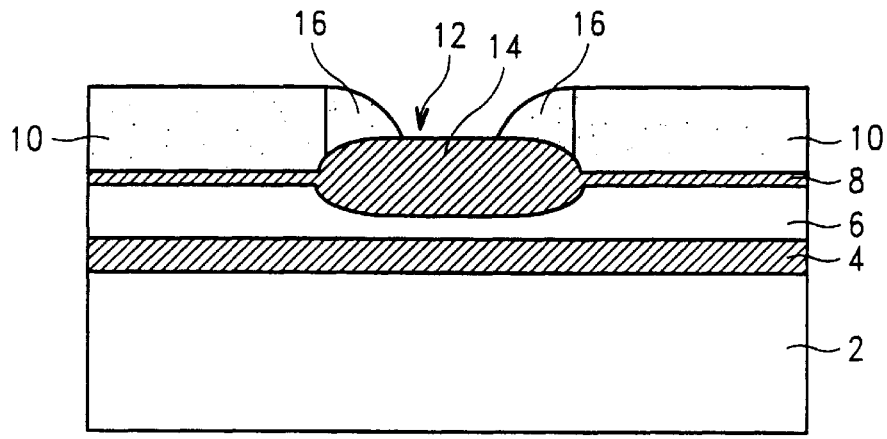
FIG. 4 is a cross-sectional view of a semiconductor wafer illustrating the step of forming spacers on side walls of silicon nitride layer according to the present invention.

Turning to FIG. 4, sidewall spacers 16 are formed on the side walls of opening 12. In order to achieve this, a thick dielectric layer is formed on the surface of the silicon nitride layer 10 and along the surface of the FOX 14, followed by an anisotropically etching. The spacers 16 expose a portion of the FOX 14. Preferably, the spacers 16 are formed of silicon nitride layer. Thus, the silicon nitride layer 10 and the spacers 16 can be simultaneously removed in one step for a subsequent step.

Figure 5:
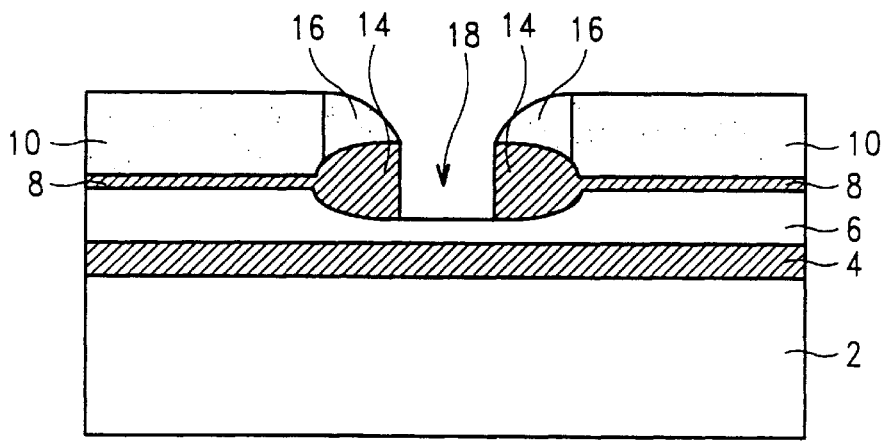
FIG. 5 is a cross-sectional view of a semiconductor wafer illustrating the step of etching the thermal oxide using the spacers as a mask according to the present invention.
Figure 6:
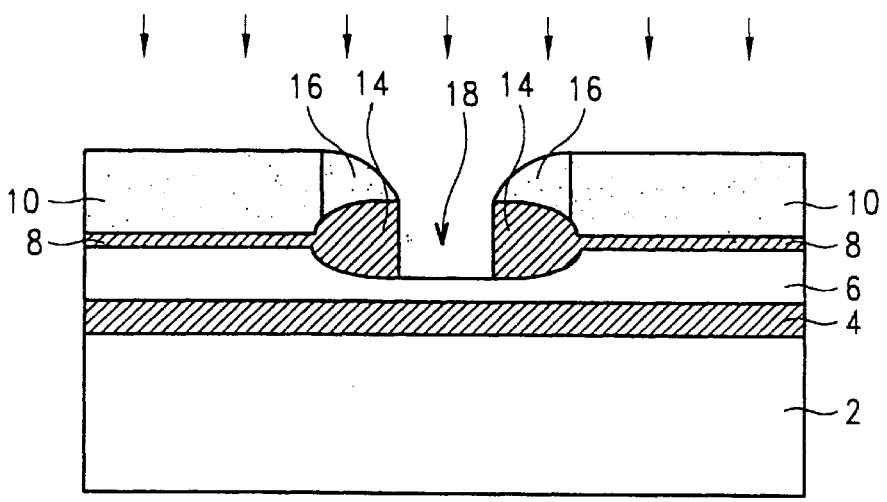
FIG. 6 is a cross-sectional view of a semiconductor wafer illustrating the step of performing an ion implantation according to the present invention.
Figure 7:
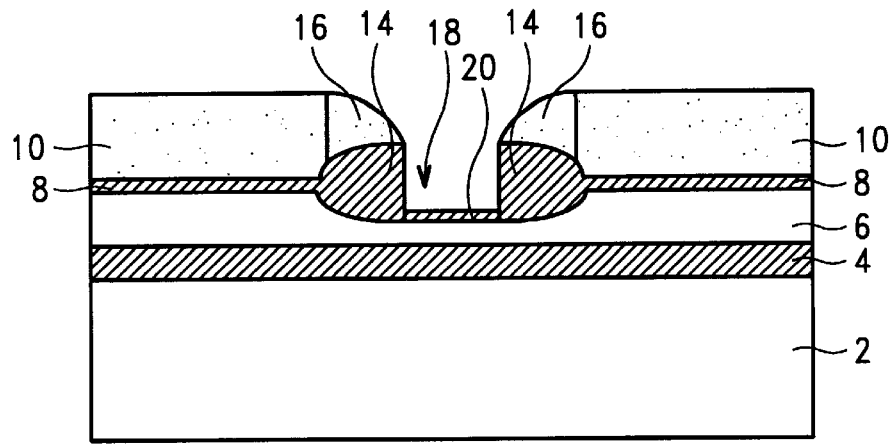
FIG. 7 is a cross-sectional view of a semiconductor wafer illustrating the step of performing a thermal oxidization according to the present invention.

Next, the exposed portion of the FOX 14 is etched using the spacers 16 as a mask, thereby exposing a portion of the silicon layer 6 and forming a deeper opening 18 in the FOX 14. The result is schemed in FIG. 5. Referring to FIG. 6, an ion implantation is performed through the opening 18 into the substrate for adjusting the threshold voltage and anti-punch-through implantation. For NMOS transistors, for example, the dopant of the ion implantation is B or $BF_2$ ions, and the dopant of the punch through stopping implantation is As, P or Sb ions. Further, the dosage and the ion implantation energy of the step are about 5E 11to 5E13atoms/$cm^2$, and about 0.1 to 50 KeV, respectively. As shown in FIG. 7, a high temperature anneal is optionally performed in ambient containing $O_2$ or $N_2O$ to recover the etching damage. The temperature is approximately 750 to 1100 degrees centigrade. Simultaneously, a dielectric layer 20 (may be an oxide or an oxynitride layer) will be formed at the bottom of the opening 18 depending on the oxidation environment.

Figure 8:
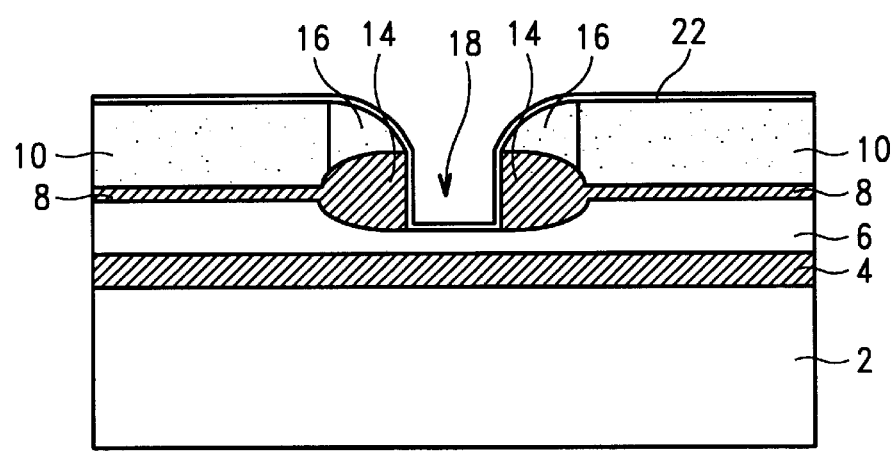
FIG. 8 is a cross-sectional view of a semiconductor wafer illustrating the step of forming a CVD oxynitride layer according to the present invention.

Turning to FIG. 8, the dielectric layer 20 is removed. Subsequently, a dielectric 22 with high permittivity (or high dielectric constant) is deposited along the surface of the feature over the substrate for later metal gate. The dielectric layer 22 is formed of tantalum pentoxide ($Ta_2O_5$), barium strontium titanate (BST) or lead zirconate titanate (PZT). Preferably, the dielectric layer is formed of nitride formed by JVD (jet vapor deposition). The silicon nitride formed by JVD is referred to JET nitride herein. The silicon nitride is one of the candidates to act the high dielectric constant thin film. The silicon nitride is an efficient barrier to suppress the boron penetration issue. An article relating to the JVD is described in IEEE, 1997, p.647, H. H. Tseng et. al, entitled "Application of JVD Nitride Gate Dielectric to A 0.35 Micron CMOS Process for Reduction of Gate Leakage And Boron Penetration". Thus, the gate leakage and boron penetration problems will be reduced by the use of JET nitride. The dielectric layer may be formed of nitride technique. Namely, the layer dielectric layer 22 is formed on the silicon nitride 10, spacers 16 and the opening 18. The material for the dielectric 22 mentioned about can be formed by a low-pressure chemical vapor deposition (LPCVD) except the JET nitride.

Figure 9:
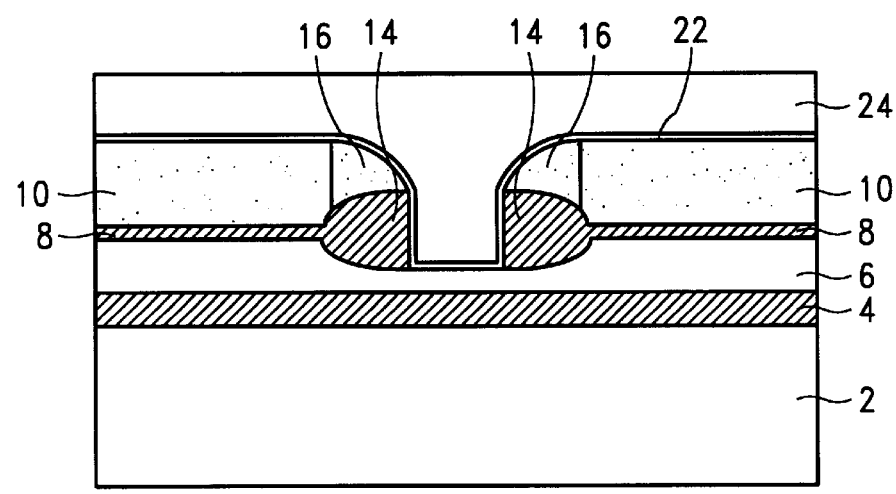
FIG. 9 is a cross-sectional view of a semiconductor wafer illustrating the step of forming a conductive layer according to the present invention.

Turning next to FIG. 9, a conductive layer composed of metal or alloy 24 is then formed on the dielectric layer 22 and refilled into the opening 18. Then, the conductive layer 24 is selected from any suitable material such as titanium, copper, aluminum, tungsten, tantalum, titanium nitride, tungsten nitride or the alloy composed thereof.

Figure 10:
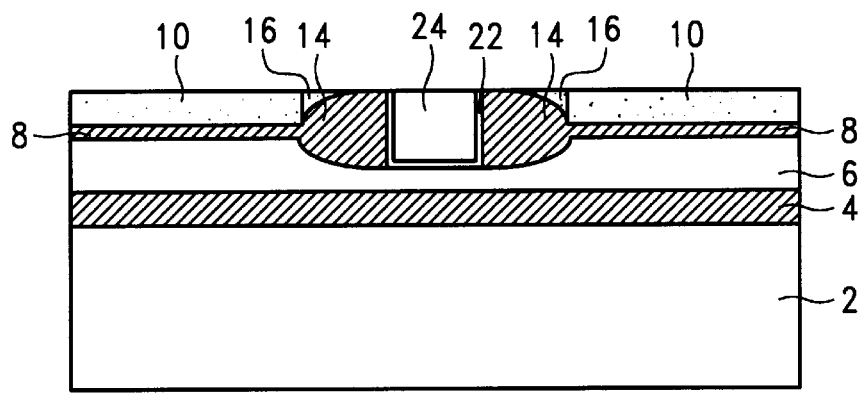
FIG. 10 is a cross-sectional view of a semiconductor wafer illustrating the step of performing a chemical mechanical polishing to remove the conductive layer according to the present invention.

Then, referring to FIG. 10, a chemical mechanical polishing (CMP) is used to remove the dielectric layer 22, silicon nitride 10 and the spacers 16 at least to the surface of the field oxide 14 such that the conductive layer remains only in the opening 18. The conductive layer in the opening 18 acts as a gate. Thus, the FOX 14 is exposed. A portion of the residual nitride 10 and spacers 16 are left over the substrate 2. In the scheme, a portion of the dielectric layer 22 under the gate 24 is used as the gate dielectric, and portions of the dielectric layer 22 remain on the side walls of the opening 18.

Figure 11:
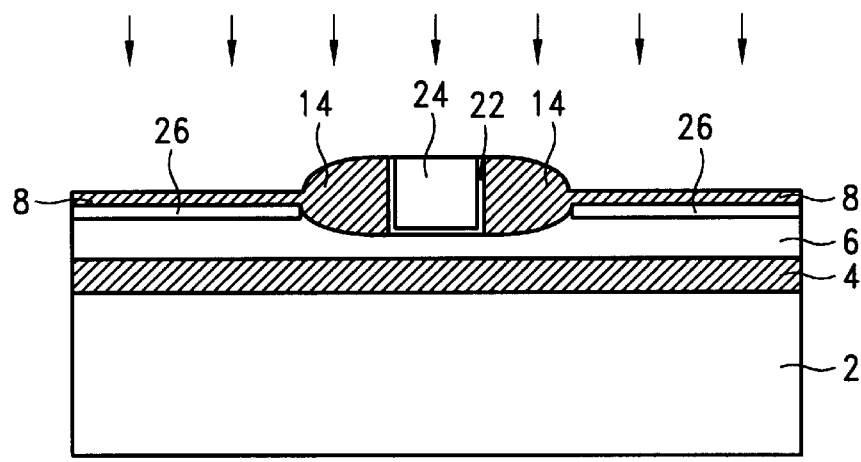
FIG. 11 a cross-sectional view of a semiconductor wafer illustrating the step of performing the gate, source and drain implantation according to the present invention.
Figure 12:
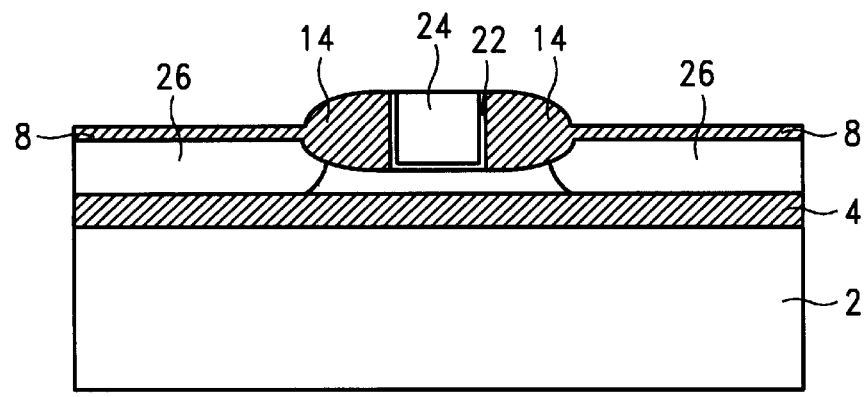
FIG. 12 is a cross-sectional view of a semiconductor wafer illustrating the step of activating the dopants according to the present invention.

Turning to FIG. 11, the residual nitride 10 and spacers are removed by hot phosphor acid solution. Successively, source and drain 26 are next created in the silicon layer 6 by an implantation. The dosage of the ion implantation is about 1E14 to 2E16 atoms/cm$^2$. The energy of the step is approximately 0.5 to 80 KeV. The dopants are subsequently activated by means of high temperature anneal in $O_2$ or $N_2O$ environment, as shown in FIG. 12. Preferably, the temperature is about 750 to 1100 degrees centigrade.

Figure 13:
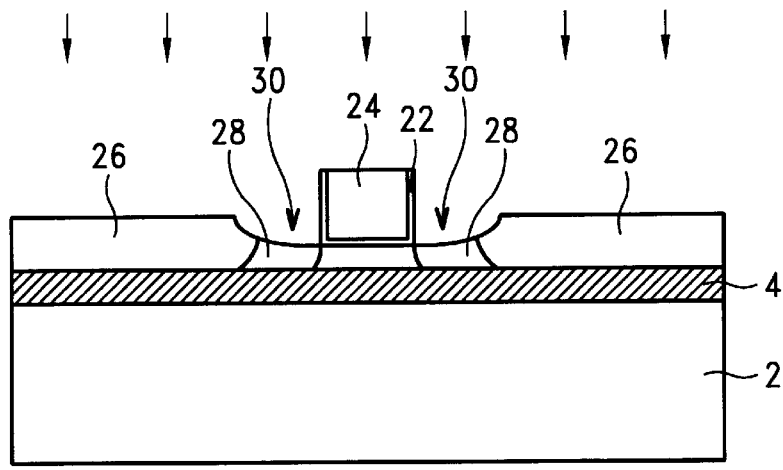
FIG. 13 a cross-sectional view of a semiconductor wafer illustrating the steps of removing the thermal oxide and forming the LDD structure according to the present invention.

Referring to FIG. 13, the pad oxide layer 8 and the FOX 14 are then removed to expose the top of the substrate. Then, a blanket ion implantation with low energy and low dose is carried out to implant dopant into the substrate to form the lightly doped drain (LDD) 28 adjacent to the gate 24. The dosage and the ion implantation energy of the step are about 1E12 to 1E14 atoms/cm$^2$, about 0.5 to 60 KeV, respectively. Recessed portions 30 of the substrate are formed adjacent to the gate 24 after the FOX 14 is removed.

Figure 14:
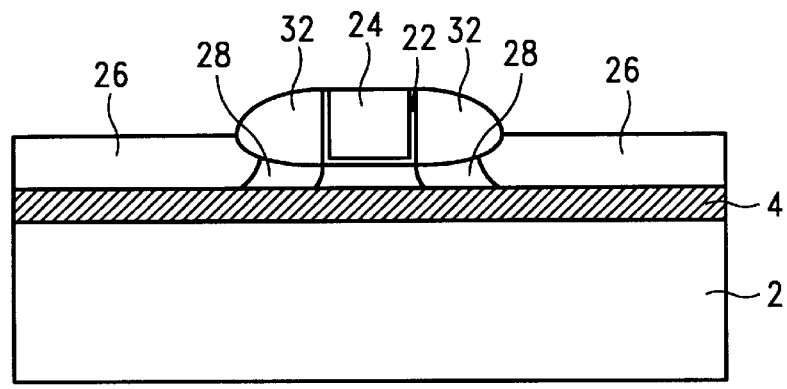
FIG. 14 is a cross-sectional view of a semiconductor wafer illustrating the step of forming oxide spacers according to the present invention.
Figure 15:
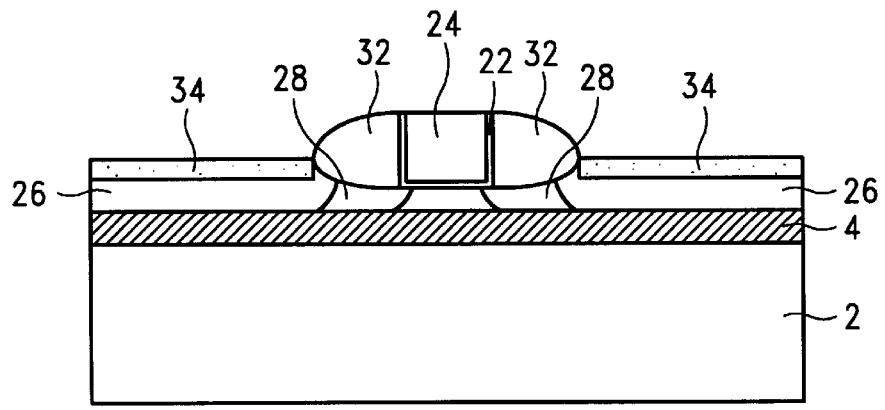
FIG. 15 is a cross-sectional view of a semiconductor wafer illustrating the step of performing a self-aligned silicide process according to the present invention.

Turning to FIG. 14, a thick oxide layer is formed on the substrate 2 by CVD, followed by etching the oxide layer to form spacers 32 on the side walls of the gate 24 and in the recessed portions 30. As shown in FIG. 15, self-aligned silicide (SALICIDE) layer 34, are respectively formed on the source and drain 26. Typically, this can be achieved by using well known processes. For example, a refractory or noble metal layer, such as Ti, Pt, Co, W, Ni etc., is deposited on the substrate 2, gate 24. Then, a first-step rapid thermal annealing (RTA) at 350 to 700 centigrade degrees in $N_2$ ambient is performed to react the refractory metal with the silicon, i.e., the substrate 2, thereby forming silicide on substrate to reduce the resistance. Then, a stripping step is used to remove non-reacted refractory metal on spacers 32 and the gate 24. Therefore, the SALICIDE layer 34 is self-aligned formed on the substrate. The temperature of the step is about 750–1050 degrees centigrade.

As will be understood by persons skilled in the art, the foregoing preferred embodiment of the present invention is illustrative of the present invention rather than limiting of the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a transistor on a semiconductor substrate having a silicon on insulator structure, said method comprising the steps of:

forming a buried oxide layer in said semiconductor substrate;

forming a pad oxide layer on said semiconductor substrate, thereby generating a silicon layer between said buried layer and said pad oxide layer;

patterning a silicon nitride layer having a first opening on said pad oxide layer to expose a portion of said pad oxide layer;

forming a thermal oxide layer on said exposed pad oxide layer by thermal oxidation to shrink said silicon layer;

forming first spacers on side walls of said first opening;

etching said thermal oxide layer by using said first spacers as a mask to expose said semiconductor substrate, thereby forming a second opening in said thermal oxide layer, wherein said second opening is deeper than said first opening;

forming a dielectric layer having relative high dielectric constant to oxide on a surface of said silicon nitride layer, said first spacers and said second opening;

forming a metal or alloy layer on said dielectric layer and in said second opening;

performing a chemical mechanical polishing technique to remove a portions of said layers over said thermal oxide layer, thereby forming a gate in said second opening;

removing said silicon nitride layer[,] and said first spacers adjacent to said thermal oxide layer;

performing a first ion implantation to form source and drain adjacent to said gate;

activating the dopants in said source and drain by thermal anneal;

removing said thermal oxide layer and said pad oxide layer;

performing a second ion implantation to form a LDD structure adjacent to said drain; and forming a second spacers on side walls of said gate.

2. The method of claim 1, further comprises a step of performing a third ion implantation to adjust the threshold voltage and anti-punch-through after etching said thermal oxide layer.

3. The method of claim 2, further comprises a step of performing an anneal to recover the etching damage after performing said third ion implantation.

4. The method of claim 3, wherein said thermal anneal to recover said etching damage is performed in $N_2O$ ambient.

5. The method of claim 3, wherein said thermal anneal to recover said etching damage is performed in $O_2$ ambient.

6. The method of claim 2, wherein the dosage of said third ion implantation is about 1E12 to 1E14 atoms/cm$^2$.

7. The method of claim 2, wherein the energy of said third ion implantation is about 0.5 to 60 KeV.

8. The method of claim 1, further comprises a step of forming a silicide layer on said source and drain after forming said second spacers.

9. The method of claim 1, further comprises following steps to form said buried oxide layer:
- implanting oxygen ions into said semiconductor substrate; and
- performing a thermal process to form said buried oxide layer.

10. The method of claim 1, wherein the dosage of said first ion implantation is about 5E11 to 5E13 atoms/cm$^2$.

11. The method of claim 1, wherein the energy of said first ion implantation is about 0.1 to 50 KeV.

12. The method of claim 1, wherein the dosage of said second ion implantation is about 1E14 to 2E16 atoms/cm$^2$.

13. The method of claim 1, wherein the energy of said second ion implantation is about 0.5 to 80 KeV.

14. The method of claim 1, wherein said dopants in said source and drain are activated $N_2/O_2$ ambient or in $O_2$ ambient.

15. The method of claim 1, wherein said second spacers are formed of silicon oxide.

16. The method of claim 1, wherein the temperature of activating said dopants is about 750 to 1100 degrees centigrade.

17. The method of claim 1, wherein said dielectric layer is selected from a group consisting of tantalum pentoxide ($Ta_2O_5$), barium strontium titanate (BST) or lead zirconate titanate (PZiT), silicon oxynitride and silicon nitride formed by JVD (jet vapor deposition).

18. The method of claim 1, wherein said metal or alloy layer is selected from a group consisting of titanium, copper, aluminum, tungsten, tantalum, titanium nitride, tungsten nitride and the composed thereof.

* * * * *